US012787843B2

(12) United States Patent
Igoshi

(10) Patent No.: US 12,787,843 B2
(45) Date of Patent: Nov. 3, 2026

(54) SEMICONDUCTOR DEVICE

(71) Applicant: DENSO CORPORATION, Kariya-city (JP)

(72) Inventor: Taro Igoshi, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 386 days.

(21) Appl. No.: 18/497,089

(22) Filed: Oct. 30, 2023

(65) Prior Publication Data

US 2024/0063150 A1 Feb. 22, 2024

Related U.S. Application Data

(63) Continuation of application No. PCT/JP2022/019961, filed on May 11, 2022.

(30) Foreign Application Priority Data

Jun. 4, 2021 (JP) ................................ 2021-094415

(51) Int. Cl.
*H01L 23/00* (2006.01)
*H10W 72/60* (2026.01)
(Continued)

(52) U.S. Cl.
CPC ........... *H10W 72/90* (2026.01); *H10W 72/60* (2026.01); *H10W 72/30* (2026.01); *H10W 72/50* (2026.01);
(Continued)

(58) Field of Classification Search
CPC ......... H01L 24/02; H01L 24/05; H01L 24/37; H01L 24/40; H01L 23/49575; H01L 24/06; H01L 24/32; H01L 24/45; H01L 24/48; H01L 24/49; H01L 24/73; H01L 25/16; H01L 2224/02185; H01L 2224/0219; H01L 2224/05553; H01L 2224/05573; H01L 2224/0603; H01L 2224/06165; H01L 2224/06181; H01L 2224/32245;
(Continued)

(56) References Cited

U.S. PATENT DOCUMENTS

2012/0068357 A1* 3/2012 Saito .................. H10W 70/466
257/774
2015/0091164 A1 4/2015 Yamagami et al.
(Continued)

FOREIGN PATENT DOCUMENTS

| | | |
|---|---|---|
| JP | 2004-047800 A | 2/2004 |
| JP | 2013-051295 A | 3/2013 |
| JP | 2021-093441 A | 6/2021 |

*Primary Examiner* — Ermias T Woldegeorgis
(74) *Attorney, Agent, or Firm* — Posz Law Group, PLC

(57) ABSTRACT

A semiconductor device includes a lead frame, a semiconductor element, a clip, a sealing material, and a thermal resistance portion. The semiconductor element is mounted on the lead frame. The clip is bonded through a bonding material to an electrode on a surface of the semiconductor element opposite to the lead frame. The sealing material covers the semiconductor element and the clip. The thermal resistance portion is disposed in a bonding region bonded through the bonding material between the semiconductor element and the clip. The thermal resistance portion has a thermal resistance higher than that of a different portion in the bonding region.

5 Claims, 8 Drawing Sheets

(51) Int. Cl.

| | |
|---|---|
| ***H10W 72/90*** | (2026.01) |
| *H10W 72/00* | (2026.01) |
| *H10W 72/30* | (2026.01) |
| *H10W 72/50* | (2026.01) |
| *H10W 90/00* | (2026.01) |

(52) U.S. Cl.

CPC .... *H10W 72/5473* (2026.01); *H10W 72/5522* (2026.01); *H10W 72/5524* (2026.01); *H10W 72/623* (2026.01); *H10W 72/634* (2026.01); *H10W 72/645* (2026.01); *H10W 72/652* (2026.01); *H10W 72/653* (2026.01); *H10W 72/655* (2026.01); *H10W 72/851* (2026.01); *H10W 72/871* (2026.01); *H10W 72/884* (2026.01); *H10W 72/886* (2026.01); *H10W 72/926* (2026.01); *H10W 72/932* (2026.01); *H10W 72/944* (2026.01); *H10W 72/9445* (2026.01); *H10W 72/981* (2026.01); *H10W 90/00* (2026.01); *H10W 90/736* (2026.01); *H10W 90/753* (2026.01); *H10W 90/756* (2026.01); *H10W 90/766* (2026.01); *H10W 90/811* (2026.01)

(58) Field of Classification Search

CPC . H01L 2224/37013; H01L 2224/37147; H01L 2224/3756; H01L 2224/37578; H01L 2224/3769; H01L 2224/40245; H01L 2224/45124; H01L 2224/45144; H01L 2224/48137; H01L 2224/48245; H01L 2224/49113; H01L 2224/73221; H01L 2224/73263; H01L 2224/73265; H01L 2924/07025; H01L 2924/10253; H01L 2924/10272; H01L 2924/13055; H01L 2924/13091; H01L 24/42; H01L 23/49524; H01L 24/26; H01L 24/83; H01L 23/49562; H01L 2224/48247; H01L 23/29; H10W 72/90; H10W 72/60; H10W 72/30; H10W 72/50; H10W 72/5473; H10W 72/5522; H10W 72/5524; H10W 72/623; H10W 72/634; H10W 72/645; H10W 72/652; H10W 72/653; H10W 72/655; H10W 72/851; H10W 72/871; H10W 72/884; H10W 72/886; H10W 72/926; H10W 72/932; H10W 72/944; H10W 72/9445; H10W 72/981; H10W 90/00; H10W 90/736; H10W 90/753; H10W 90/756; H10W 90/766; H10W 90/811; H10W 72/073; H10W 70/481; H10W 70/466; H10W 74/40

See application file for complete search history.

(56) References Cited

U.S. PATENT DOCUMENTS

| | | | | |
|---|---|---|---|---|
| 2018/0047698 | A1 | 2/2018 | Yamagami et al. | |
| 2019/0326204 | A1 * | 10/2019 | Miura ................. | H10W 70/411 |
| 2021/0257281 | A1 | 8/2021 | Miura | |

* cited by examiner

SEMICONDUCTOR DEVICE

CROSS REFERENCE TO RELATED APPLICATIONS

The present application is a continuation application of International Patent Application No. PCT/JP2022/019961 filed on May 11, 2022, which designated the U.S. and claims the benefit of priority from Japanese Patent Application No. 2021-094415 filed on Jun. 4, 2021. The entire disclosures of all of the above applications are incorporated herein by reference.

TECHNICAL FIELD

The present disclosure relates to a semiconductor device in which a clip is bonded to a semiconductor element.

BACKGROUND

There is known a semiconductor device in which a clip as a plate-shaped member is bonded to an electrode of the semiconductor element and the clip and the semiconductor element are covered with a sealing material made of a resin. For example, such a semiconductor device includes, in addition to the clip, the semiconductor element and the sealing material, a die pad, a plurality of leads, and a bonding material. The clip is bonded to the electrode of the semiconductor element and some of the leads through the bonding material, so that the semiconductor element and some of the leads are electrically connected to each other.

SUMMARY

The present disclosure describes a semiconductor device having a clip bonded to a semiconductor element. According to an aspect of the present disclosure, a semiconductor device includes a lead frame, a semiconductor element, a clip, a sealing material, and a thermal resistance portion. The semiconductor element is disposed on the lead frame. The clip is bonded through a bonding material to an electrode on a surface of the semiconductor element opposite to the lead frame. The sealing material covers the semiconductor element and the clip. The thermal resistance portion is disposed in a bonding region that is a region between the semiconductor element and the clip and bonded through the bonding material. The thermal resistance portion has a thermal resistance higher than that of a different area in the bonding region.

BRIEF DESCRIPTION OF DRAWINGS

Objects, features and advantages of the present disclosure will become more apparent from the following detailed description made with reference to the accompanying drawings, in which.

DETAILED DESCRIPTION

Figure 1:
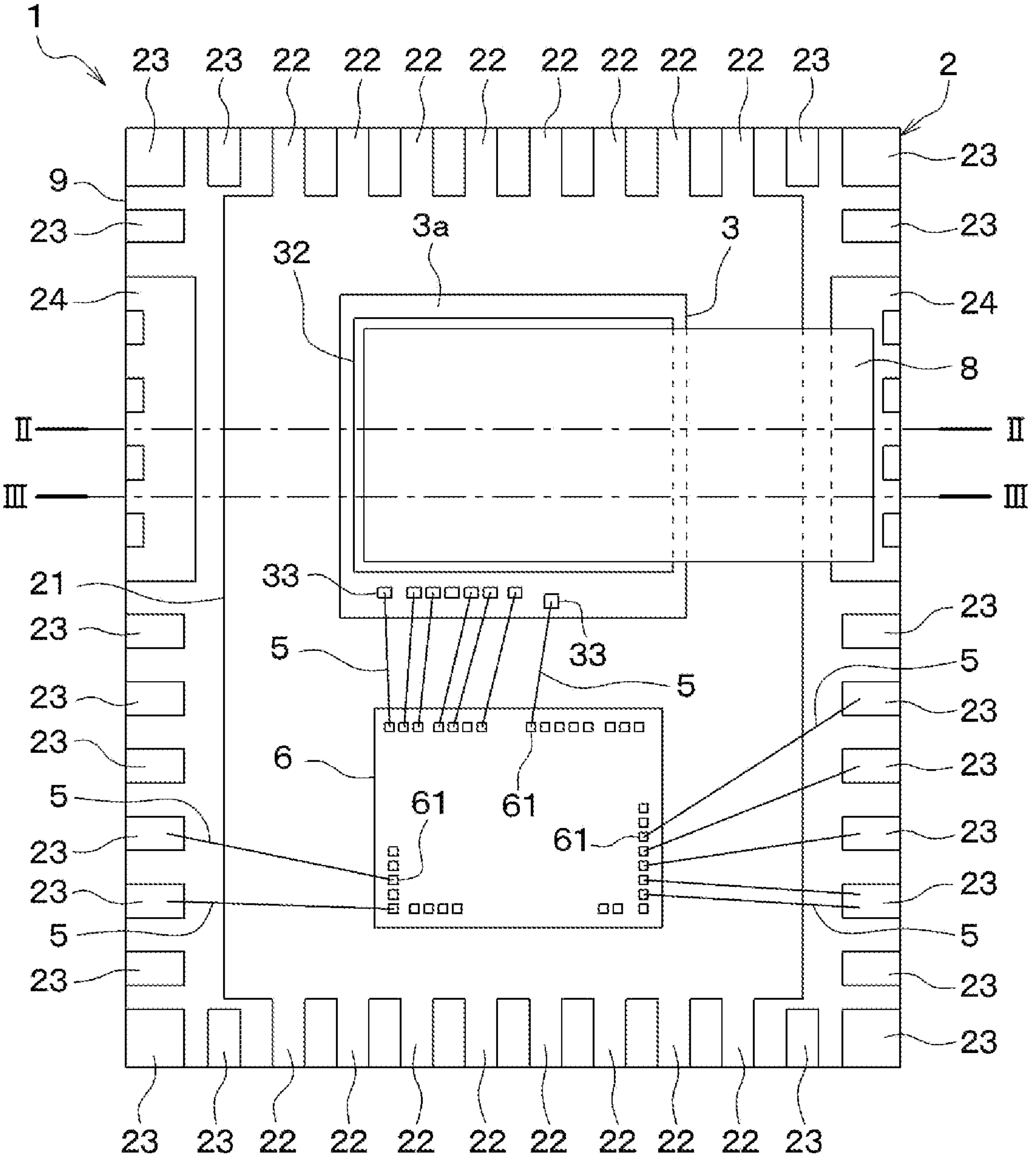
FIG. 1 is a diagram illustrating a top layout view of a semiconductor device according to a first embodiment.

To begin with, a relevant technology will be described only for understanding the embodiments of the present disclosure.

For example, it has been known a semiconductor device including a die pad, a plurality of leads, a semiconductor element, a clip, a bonding material and a sealing resin. The clip is bonded to the electrode of the semiconductor element and some of the leads with the bonding material, so as to electrically connect the semiconductor element and some of the leads.

In such a semiconductor device, a heat dissipation property of the semiconductor element is enhanced by increasing the area of a bonding portion between the semiconductor element and the clip as much as possible and reducing the thermal resistance at the bonding portion.

The inventor of the present disclosure has had intensive studies on improvement in reliability in the semiconductor device having such a structure. As a result, the inventor of the present disclosure has found that current concentration occurs, due to local heat generation, in the vicinity of the bonding portion of the semiconductor element to which the clip is bonded, which may result in an occurrence of damage.

The present disclosure provides a semiconductor device in which a clip is bonded to a semiconductor element, and which is capable of suppressing local heat generation in the vicinity of a bonding portion between the semiconductor element and the clip to thereby improve the reliability.

According to an aspect of the present disclosure, a semiconductor device includes: a lead frame; a semiconductor element disposed on the lead frame; a clip bonded through a bonding material to an electrode on a surface of the semiconductor element opposite to the lead frame; a sealing material covering the semiconductor element and the clip; and a thermal resistance portion disposed in a bonding region that is a region between the semiconductor element and the clip and bonded through the bonding material. The thermal resistance portion has a thermal resistance higher than that of an area different from the thermal resistance portion in the bonding region.

In the semiconductor device according to the first aspect, the thermal resistance portion is disposed in the bonding region bonded with the bonding material between the semiconductor element and the clip, and the thermal resistance of the thermal resistance portion is higher than that of the other portion in the bonding region. In this configuration, a heat dissipation property of a portion of the bonding region where the thermal resistance portion is disposed is lower than that in the other portion of the bonding region, and thus the amount of heat generation is relatively large. As a result, a region having the low heat dissipation property is dispersed, and local heat concentration between the clip having the high heat dissipation property and the region having the low heat dissipation property in the vicinity of the clip in the semiconductor device is suppressed. In this semiconductor device, therefore, since the region having the low heat dissipation property is intentionally provided, the local heat concentration in the vicinity of the connecting portion between the semiconductor element and the clip is suppressed, and current concentration and damage due to the local heat concentration are suppressed. Accordingly, the reliability of the semiconductor device is improved.

According to a second aspect of the present disclosure, a semiconductor device includes: a lead frame; a semiconductor element disposed on the lead frame; a clip connected through a bonding material to an electrode on a surface of the semiconductor element opposite to the lead frame; and a sealing material covering the semiconductor element and the clip. The clip includes a plurality of bonding portions that are spaced apart from each other and bonded to the semiconductor element through the bonding material. The plurality of bonding portions includes at least two bonding portions that are extended parallel to each other and respectively connected to regions of the electrode including vicinities of an outer contour of the electrode.

In the semiconductor device according to the second aspect, the semiconductor element and the clip are bonded to each other, and the clip includes the plurality of bonding portions bonded to the semiconductor element through the bonding material. The plurality of bonding portions are arranged apart from each other. Namely, in a portion of the electrode disposed between the bonding portions of the clip, the clip having a high heat dissipation property is not connected. Therefore, the heat dissipation property of the portion of the electrode to which the clip is not bonded is lower than the bonding portions. As a result, a region having the low heat dissipation property is dispersed, and local heat concentration between the clip having the high heat dissipation property and the region having the low heat dissipation property in the vicinity of the clip in the semiconductor device is suppressed. In this semiconductor device, therefore, since the region having the low heat dissipation property is intentionally provided, the local heat concentration in the vicinity of the connecting portion between the semiconductor element and the clip is suppressed, and current concentration and damage due to the local heat concentration are suppressed. Accordingly, the reliability of the semiconductor device is improved.

In addition, in the semiconductor device, at least two of the plurality of bonding portions are extended parallel to each other, and are bonded to the vicinities of the outer contour of the electrode of the semiconductor element. Therefore, the area of a portion of the electrode located adjacent to the outer contour than the bonding portions is reduced. In such a configuration, the area of the portion of the electrode of the semiconductor element having a low heat dissipation property on an outer periphery of the bonding portion is reduced. Thus, a region having a low heat dissipation property can be kept minimum.

According to a third aspect of the present disclosure, a semiconductor device includes: a lead frame; a semiconductor element disposed on the lead frame; a plurality of clips connected to a surface of the semiconductor element opposite to the lead frame through a bonding material; and a sealing material covering the semiconductor element and the clips. The plurality of clips are disposed to be spaced apart from each other.

In the semiconductor device according to the third aspect, a plurality of different clips are bonded to one semiconductor element through the bonding material, and the plurality of clips are disposed apart from each other. Thus, a portion of the surface of the semiconductor element located between the plurality of clips has a lower heat dissipation property than the other portion. As a result, similarly to the semiconductor devices described above, the region having the low heat dissipation property is dispersed. As such, the local heat concentration in the vicinity of the clip is suppressed, and current concentration and damage due to the local heat concentration are suppressed. Further, the effect of improving the reliability is achieved.

Embodiments of the present disclosure will be described hereinafter with reference to the drawings. In the following description, the same or equivalent parts are denoted by the same reference numerals throughout the embodiments.

First Embodiment

A semiconductor device 1 of a first embodiment will be described. The semiconductor device 1 of the present embodiment is, for example, used for an in-vehicle application to be mounted on a vehicle such as an automobile. However, the semiconductor device 1 of the present embodiment can be of course adopted in any other applications.

In FIG. 1, in order to ease understanding of respective members constituting the semiconductor device 1 and their arrangement relationship, a part of an outer contour of each member covered with a sealing material 9, which will be described later, is indicated by a solid line, and an outer contour of a part covered with a member other than the sealing material 9 is indicated by a broken line.

<Basic Configuration>

Figure 2:
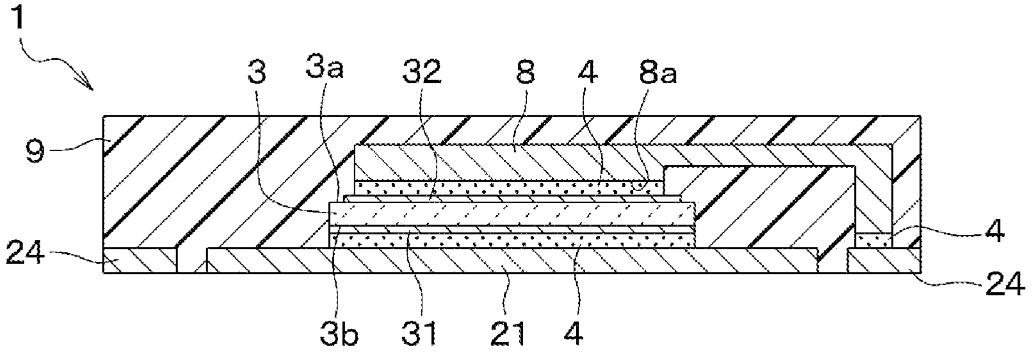
FIG. 2 is a diagram illustrating a cross-sectional view taken along a line II-II in FIG. 1.
Figure 3:
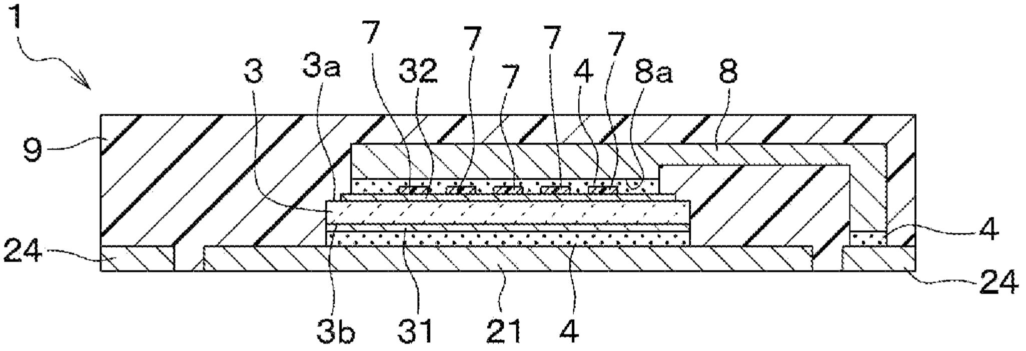
FIG. 3 is a diagram illustrating a cross-sectional view taken along a line III-III in FIG. 1.

As shown in FIG. 1, for example, the semiconductor device 1 of the present embodiment includes a lead frame 2, a semiconductor element 3, a wire 5, a control integrated circuit (IC) 6, a clip 8, and a sealing material 9. The lead frame 2 includes a die pad 21 and a plurality of leads 22 and 23. As shown in FIGS. 2 and 3, for example, the semiconductor device 1 further includes a bonding material 4 used for connecting the semiconductor element 3 and the clip 8, and an insulating layer 7 disposed between the semiconductor element 3 and the clip 8.

The lead frame 2 includes, for example, the die pad 21, a plurality of first leads 22 extending from the die pad 21 toward an outer peripheral side, a plurality of second leads 23 independent from the die pad 21, and a plurality of third leads 24 independent from the die pad 21. The lead frame 2 is made of, for example, an arbitrary metal material, such as copper (Cu) or iron (Fe), an alloy material thereof, or the like. In the lead frame 2, for example, during a manufacturing of the semiconductor device 1, the die pad 21 and the plurality of leads 23 and 24 are in the state of being connected to each other by tie bars (not shown). When the tie bars are removed by punching after the sealing material 9 is molded, the die pad 21 and the plurality of leads 23 and 24 are separated from each other.

For example, as shown in FIG. 2, the semiconductor element 3 and the control IC 6 for driving and controlling the semiconductor element 3 are mounted on the die pad 21 through the bonding material 4. For example, a surface of the die pad 21 opposite to a mounting surface on which the semiconductor element 3 is mounted is exposed from the sealing material 9. The same applies to the plurality of first leads 22 extending from the die pad 21 outward, and the plurality of second leads 23 and third leads 24, which are independent from the die pad 21.

The plurality of first leads 22 are, for example, arranged parallel to each other with a distance therebetween and extend from the die pad 21 toward an outer peripheral side. The end surfaces of the plurality of first leads 22 on the side opposite to the die pad 21 are exposed from the sealing material 9. The same applies to the second leads 23 and the third leads 24.

The second leads 23 are independent from the die pad 21 and the third leads 24. For example, the second leads 23 are arranged parallel to each other and separated from each other. Of the plurality of second leads 23, some of the second leads 23 are electrically connected to the control IC6 via, for example, the wires 5, and are used for driving the control IC6.

The third lead 24 has a planar size larger than that of the second lead 23, and the clip 8 is bonded to the third lead 24 through the bonding material 4. The third lead 24 is electrically connected to the second electrode 32 of the semiconductor element 3 through the clip 8, and serves as a current path when the semiconductor element 3 is driven.

The configuration of the lead frame 2 described above is merely an example, and the number, size, arrangement, and the like of the die pads 21 and the leads 22 to 24 may be appropriately changed according to the number, size, and the like of the semiconductor elements 3 and the control ICs 6 to be mounted. In addition, for example, exterior plating (not shown) made of gold (Au), tin (Sn), or the like may be applied to some or all regions of the lead frame 2.

The semiconductor element 3 is, for example, a vertical power element, such as a metal oxide semiconductor field effect transistor (MOSFET) or an insulated gate bipolar transistor (IGBT). For example, the semiconductor element 3 is mainly formed of a semiconductor material such as silicon (Si) or silicon carbide (SiC) and has a rectangular plate shape. The semiconductor element 3 is manufactured by a known semiconductor process. In the semiconductor element 3, for example, a surface opposite to the lead frame 2 is defined as a front surface 3*a*, and a surface facing the lead frame 2 is defined as a back surface 3*b*. The semiconductor element 3 has electrodes on the front surface 3*a* and the back surface 3*b*, respectively. In the semiconductor element 3, for example, a first electrode 31 is formed on the back surface 3*b*, and a second electrode 32 paired with the first electrode 31 and the plurality of third electrodes 33 are formed on the front surface 3*a*. In the semiconductor element 3, for example, the first electrode 31 functions as a drain electrode, the second electrode 32 functions as a source electrode, and the third electrode 33 functions as a gate electrode. In the semiconductor element 3, the first electrode 31 is bonded to the die pad 21 through the bonding material 4, and the second electrode 32 is bonded to the clip 8 through the bonding material 4. In the semiconductor element 3, the third electrodes 33 are electrically connected to the control IC 6 through the wires 5. The control IC 6 controls to turn on and off the current between the first electrode 31 and the second electrode 32.

The bonding material 4 is, for example, a conductive bonding material such as solder, and is made of any bonding material.

The wire 5 is made of, for example, a metal material such as gold (Au) or aluminum (Al), and is connected to the lead frame 2, the semiconductor element 3, or the control IC 6 by wire bonding.

The control IC 6 is a control element including a control circuit used for current control of the semiconductor element 3. The control IC 6 is, for example, an arbitrary element for power supply control corresponding to a power element such as a MOSFET. The control IC 6 has, for example, a plurality of electrode pads 61 on one surface thereof. The electrode pads 61 are connected to the third electrode 33 of the semiconductor element 3 and the plurality of leads 23 through the wires 5 to enable electrical connection between the semiconductor element 3 and an external power supply and the like. For example, the control IC 6 is mounted on the die pad 21 through the bonding material 4, similarly to the semiconductor element 3.

For example, as shown in FIG. 3, the insulating layer 7 is a member that is disposed between the second electrode 32 of the semiconductor element 3 and the clip 8 and functions as a thermal resistance portion that intentionally increases the thermal resistance of a part of a region between the second electrode 32 and the clip 8. The insulating layer 7 is made of any insulating material. For example, the insulating layer 7 is made of polyimide-isoindolo quinazolinedione (PIC)) or a resist material, and is applied and deposited by a dispenser or the like. The insulating layer 7 serves to intentionally form a region having a low heat dissipation property between the second electrode 32 and the clip 8 and to disperse a region having a low heat dissipation property, thereby to suppress local heat concentration in a region near the clip 8. The configuration of the insulating layer 7 will be described later in detail.

The clip 8 is a wiring member that is made of, for example, a metal material having high electrical conductivity and thermal conductivity such as copper (Cu) or an alloy material thereof and electrically connects the semiconductor element 3 and the third lead 24. The clip 8 has a first end bonded to the second electrode 32 of the semiconductor element 3 through the bonding material 4, and a second end bonded to the third lead 24 through the bonding material 4. As shown in FIG. 2, for example, the clip 8 is configured such that the thickness of a portion bonded to the semiconductor element 3 is larger than the thickness of the other portion. For example, to form the clip 8, a plate material made of Cu or the like is prepared, and a portion having a partially small thickness is formed in the plate material by cutting, half etching, or the like. Then, the plate material is bent. The clip 8 is not limited to the configuration described above. The clip 8 may have a uniform thickness. The clip 8 having the uniform thickness is obtained by bending a plate material made of Cu or the like.

The sealing material 9 is made of an arbitrary resin material having an insulating property and a curable property, such as an epoxy resin. The sealing material 9 is a member that covers a part of the lead frame 2 and other constituent members of the semiconductor device 1. The sealing material 9 is molded by any resin molding method such as a compression molding using a mold (not shown), for example.

The semiconductor device 1 of the present embodiment has the basic configuration as described above.

<Insulating Layer>

Next, a configuration, an effect, and the like of the insulating layer 7 will be described in comparison with a semiconductor device 100 of a comparative example that does not have the insulating layer 7.

Figure 4:
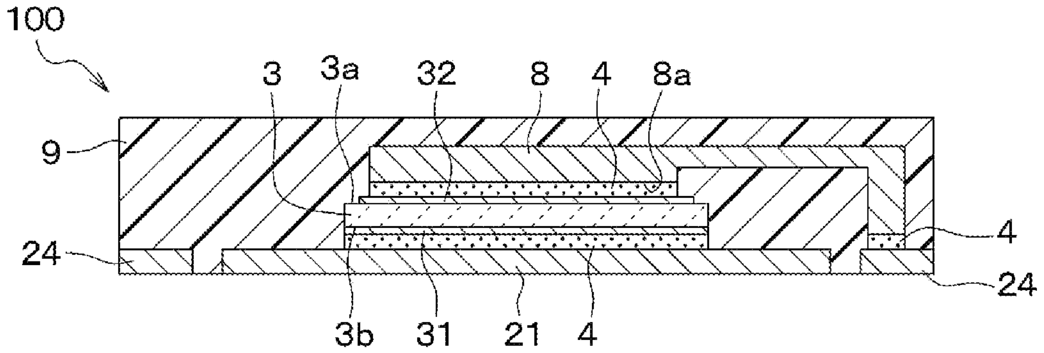
FIG. 4 is a diagram illustrating a cross-sectional view of a semiconductor device, corresponding to FIG. 2, according to a comparative example to the first embodiment.

As shown in FIG. 4, for example, the semiconductor device 100 of the comparative example has the same basic configuration as the semiconductor device 1 of the first embodiment. However, the semiconductor device 100 of the comparative example does not have the insulating layer 7, and that the insulating layer 7 is not disposed between the semiconductor element 3 and the clip 8. In the semiconductor device 100 of the comparative example, the clip 8 is bonded to the second electrode 32 of the semiconductor element 3, and the bonding area between the second electrode 32 and the clip 8 is approximately the same as the planar area of the second electrode 32. Thus, in the semiconductor device 100 of the comparative example, the resistance at the bonding portion between the second electrode 32 of the semiconductor element 3 and the clip 8 is small, and the amount of heat generation due to the connection resistance at the bonding portion is reduced.

Figure 5:
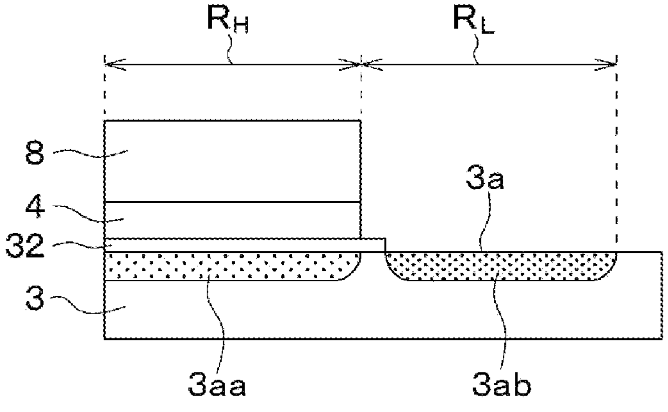
FIG. 5 is a diagram for explaining local heat concentration in the semiconductor device according to the comparative example.

As shown in FIG. 5, for example, the semiconductor device 100 of the comparative example includes a direct underneath portion 3*aa* positioned directly below a region of the front surface 3*a* to which the clip 8 is bonded, and a neighboring portion 3*ab* which is a portion near the direct underneath portion 3*aa* and to which the clip 8 is not bonded. The direct underneath portion 3*aa* directly below the region to which the clip 8 made of Cu or the like having high thermal conductivity is bonded serves as a high heat dissipation region $R_H$. On the other hand, the neighboring portion 3*ab* on which the sealing material 9 having a thermal conductivity lower than that of the clip 8 is disposed serves as a low heat dissipation region $R_L$.

The inventor of the present disclosure evaluated the reliability in the semiconductor device 100 of the comparative example. As a result, it was found that an overcurrent occurs near the clip 8, that is, in the vicinity of the neighboring portion 3*ab* or the boundary portion between the direct underneath portion 3*aa* and the neighboring portion 3*ab*, resulting in dielectric breakdown. The reason of this occurrence of overcurrent is considered because a local heat concentration occurs at the boundary between the high heat dissipation region $R_H$ and the low heat dissipation region $R_L$ due to a large difference in heat dissipation between the high heat dissipation region $R_H$ and the low heat dissipation region $R_L$. Specifically, when the local heat concentration occurs in the semiconductor element 3, the temperature of the portion where the heat is concentrated rises more than other portions, and the electrical resistance thus decreases. As the electrical resistance decreases, the quantity of current increases at the portion where the heat is concentrated. With this, the amount of heat generation further increases, and results in the further decrease in the electrical resistance. It is considered that the repetition of this cycle causes a local decrease in the withstand voltage of the semiconductor element 3 and eventually results in breakage. Therefore, in order to suppress such damage, it is necessary to disperse the heat generation regions.

Figure 6A:
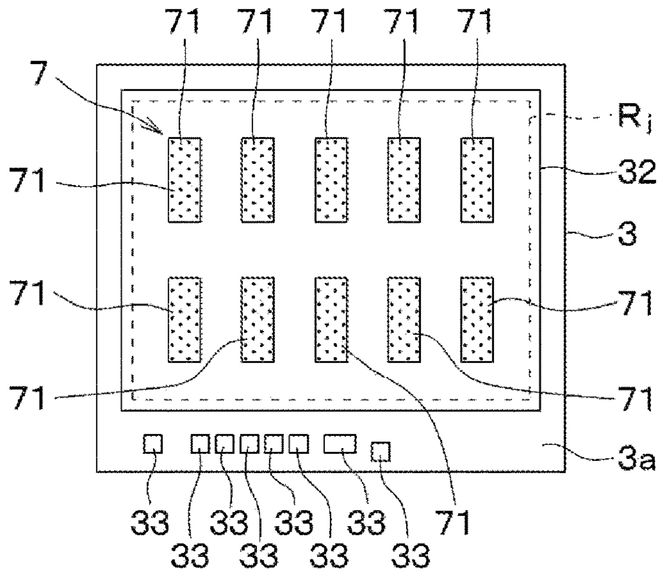
FIG. 6A is a diagram illustrating a first arrangement example of an insulating layer as a thermal resistance portion between a semiconductor element and a clip.

On the other hand, in the semiconductor device 1 of the present embodiment, as shown in FIG. 6A, a region that is between the semiconductor element 3 and the clip 8 and is bonded through the bonding material 4 is defined as a bonding region $R_j$, and the insulating layer 7 serving as a thermal resistance portion is disposed in the bonding region $R_j$.

The insulating layer 7 can be provided by, for example, a plurality of island portions 71 that are arranged apart from each other into an island shape. Each of the plurality of island portions 71 has, for example, a substantially quadrangular shape in a top view, and is disposed inside the outer contour of the bonding region $R_j$. Each of the island portions 71 serves to increase the thermal resistance in a region inside the outer contour of the clip 8. That is, a portion of the bonding surface 8*a* of the clip 8 located above the island portion 71 has a lower heat dissipation property than the other portion of the bonding surface 8*a*. Thus, the heat generation region in the bonding surface 8*a* of the clip 8 is dispersed by the number of the island portions 71. As a result, the heat concentration in the vicinity of the clip 8 is relaxed, and the current concentration and damage caused thereby are suppressed.

Figure 6B:
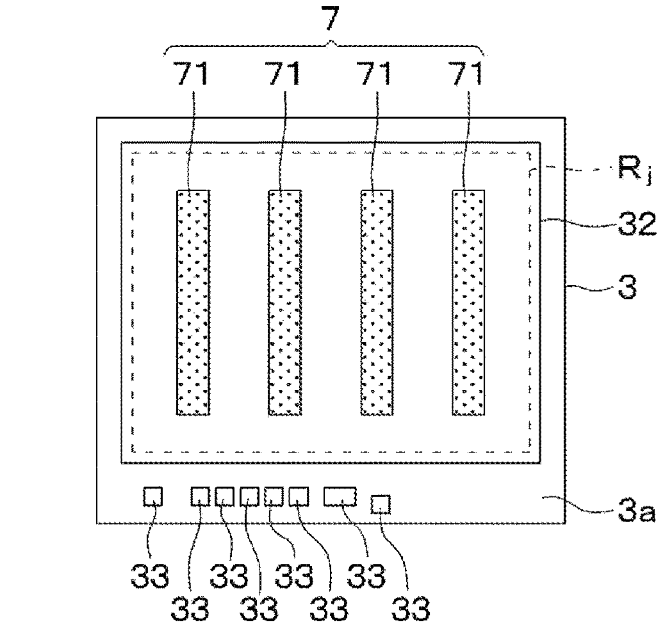
FIG. 6B is a diagram illustrating a second arrangement example of the insulating layer as the thermal resistance portion.
Figure 6C:
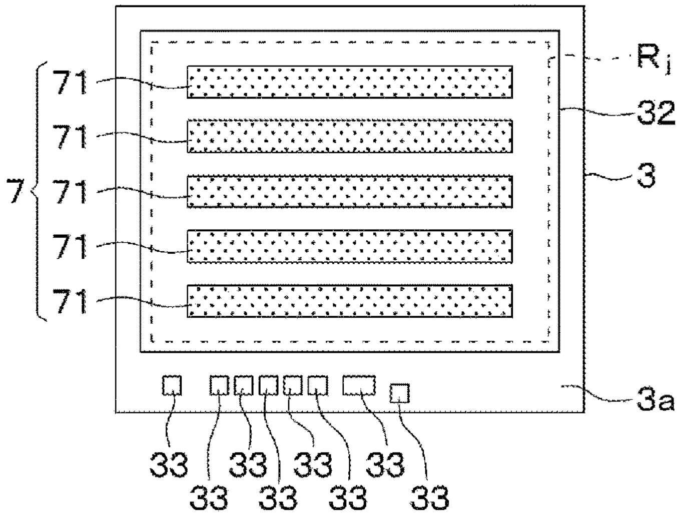
FIG. 6C is a diagram illustrating a third arrangement example of the insulating layer as the thermal resistance portion.
Figure 6D:
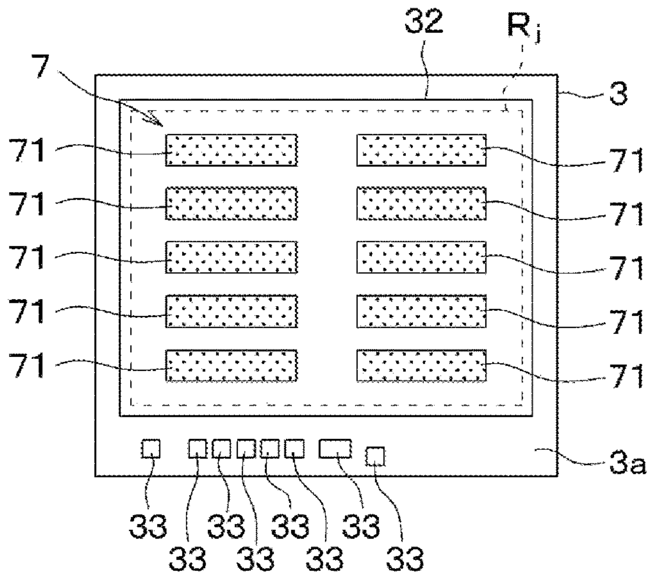
FIG. 6D is a diagram illustrating a fourth arrangement example of the insulating layer as the thermal resistance portion.
Figure 6E:
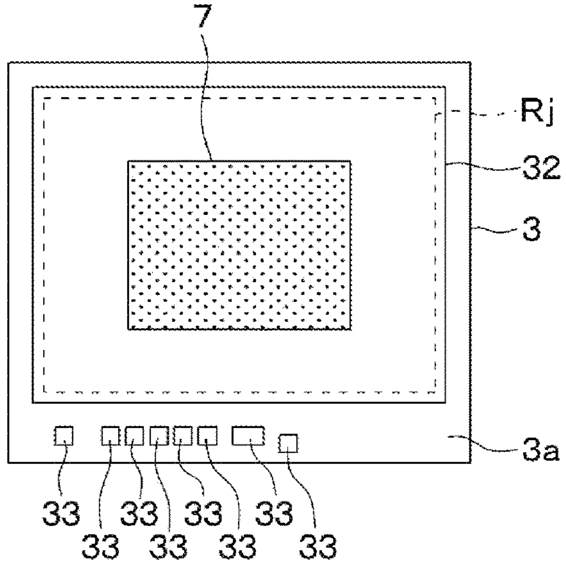
FIG. 6E is a diagram illustrating a fifth arrangement example of the insulating layer as the thermal resistance portion.
Figure 6F:
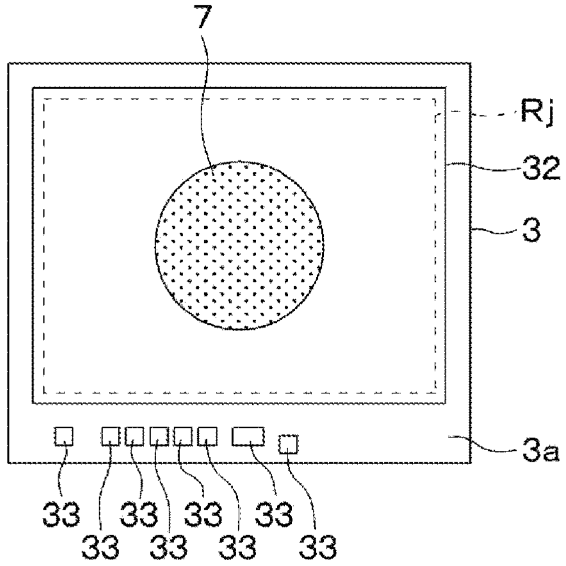
FIG. 6F is a diagram illustrating a sixth arrangement example of the insulating layer as the thermal resistance portion.

The insulating layer 7 is not limited to the example shown in FIG. 6A. For example, as shown in FIG. 6B, the insulating layer 7 may be provided by four island portions 71 having a substantially rectangular shape in a top view. The four island portions 71 are aligned to extend in a vertical direction of the paper surface of FIG. 6B as a longitudinal direction, and are arranged parallel to each other. As other examples, as shown in FIGS. 6C and 6D, the insulating layer 7 may have a configuration in which a plurality of island portions 71 are aligned to extend in a left and right direction of the paper surface of FIG. 6C or 6D, and are arranged parallel to each other. As further another example, as shown in FIG. 6E, the insulating layer 7 may have a substantially rectangular shape in a top view. That is, only one insulating layer 7 may be provided at a position separated from the outer contour of the bonding region $R_j$. In other words, only one insulating layer 7 may be disposed in a predetermined region including the center of the bonding region $R_j$. As still another example, as shown in FIG. 6F, the insulating layer 7 may have a substantially circular shape in a top view.

As described above, the insulating layer 7 may have any configuration as long as the insulating layer 7 is disposed at a position separated from the vicinity of the outer contour of the bonding region R; and can disperse the heat generation region in the clip 8. The shape of the outer contour of the insulating layer 7, the arrangement of the insulating layer 7, the number and arrangement of the island portions 71, and the like may be appropriately changed. From the viewpoint of dispersion of heat generation region in the clip 8, the insulating layer 7 is preferably configured to have a plurality of island portions 71.

Figure 7:
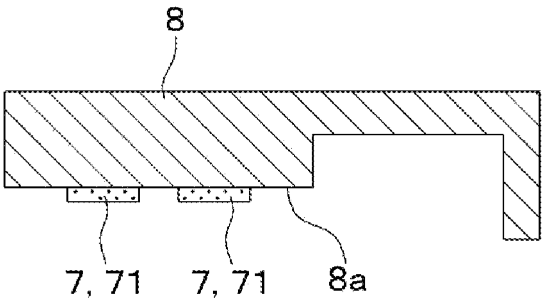
FIG. 7 is a diagram illustrating an example of a clip to which an insulating layer is integrated.

The insulating layer 7 is at least disposed between the second electrode 32 and the bonding surface 8*a* of the clip 8. For example, as shown in FIG. 7, the insulating layer 7 may be formed on the bonding surface 8*a* of the clip 8. In this case, for example, before the clip 8 is bonded to the semiconductor element 3, the insulating layer 7 is film-formed in a pattern on the bonding surface 8*a* of the clip 8 in advance. In addition, the insulating layer 7 may have a configuration in which a plurality of island portions 71 are arranged on the bonding surface 8*a*, or only one insulating layer 7 is arranged on the bonding surface 8*a*. The arrangement, the configuration, and the like of the insulating layer 7 may be appropriately changed, similarly to the case where the insulating layer 7 is formed on the semiconductor element 3 side.

According to the present embodiment, since the insulating layer 7 is disposed between the semiconductor element 3 and the clip 8, the semiconductor device 1 has a configuration in which the thermal resistance portion having a low heat dissipation property intentionally exists on the bonding surface 8*a* of the clip 8. In the semiconductor device 1, thus, heat generation in the bonding region $R_j$ between the semiconductor element 3 and the clip 8 is dispersed. As a result, heat concentration in the neighboring portion 3*ab* located in the vicinity of the outer contour of the clip 8 in the semiconductor element 3 is suppressed, and current concentration and damage caused by the heat concentration are also suppressed. As such, an effect of improving reliability is obtained.

Second Embodiment

A semiconductor device 1 of a second embodiment will be hereinafter described.

Figure 8:
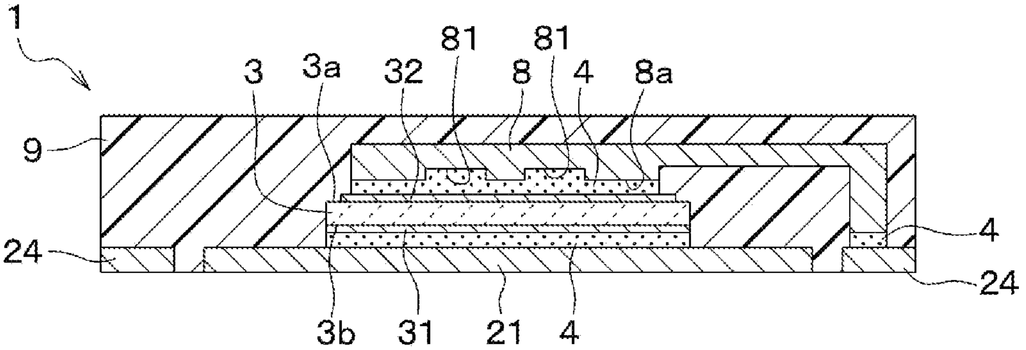
FIG. 8 is a diagram illustrating a cross-sectional view of a semiconductor device, corresponding to FIG. 2, according to a second embodiment.

The semiconductor device 1 of the present embodiment is different from the semiconductor device 1 of the first embodiment in that the insulating layer 7 is not provided and the bonding surface 8*a* of the clip 8 has an uneven shape as shown in FIG. 8, for example. Hereinafter, the differences from the first embodiment will be mainly described.

In the present embodiment, the clip 8 is formed with a plurality of recessed portions 81 on a bonding surface 8*a*. The recessed portions 81 are recessed in a direction separating from the semiconductor element 3. In the clip 8, the bonding surface 8*a* is bonded to the second electrode 32 of the semiconductor element 3 through the bonding material 4, and the recessed portions 81 is filled with the bonding material 4. In the clip 8, the recessed portions 81 are separated from the semiconductor element 3 more than the other portion of the bonding surface 8*a*, and thus the recessed portions 81 function as the thermal resistance portions having a thermal resistance higher than the other portion. That is, in the clip 8, the recessed portion 81 has a lower heat dissipation property than the other portion of the bonding surface 8*a*, and thus the amount of heat generation in the recessed portion 81 is larger than the other portion of the bonding surface 8*a*. Therefore, the clip 8 can be substantially in the same state as the case where the insulating layer 7 is disposed. As such, the semiconductor device 1 of the present embodiment has a configuration in which the heat generation region on the bonding surface 8*a* of the clip 8 is dispersed, and local heat concentration in the neighboring portion 3*ab* of the semiconductor element 3 is suppressed.

Note that the bonding surface 8*a* may have only one recessed portion 81, or may have a plurality of recessed portions 81. In the case where the bonding surface 8*a* has the plurality of recessed portions 81, the recessed portions 81 may be apart from each other. For example, the recessed portion 81 has a rectangular groove shape with a depth of about 10 μm. However, the shape of the recessed portion 81 is not particularly limited. The depth, shape, dimension, and the like of the recessed portion 81 may be appropriately changed.

The semiconductor device 1 of the present embodiment achieves the similar effects to those of the first embodiment. In addition, since the semiconductor device 1 of the present embodiment does not require the insulating layer 7, there is no influence of aging deterioration of the insulating layer 7, and an effect of further improving reliability can be achieved.

Third Embodiment

A semiconductor device 1 according to a third embodiment will be hereinafter described.

Figure 9:
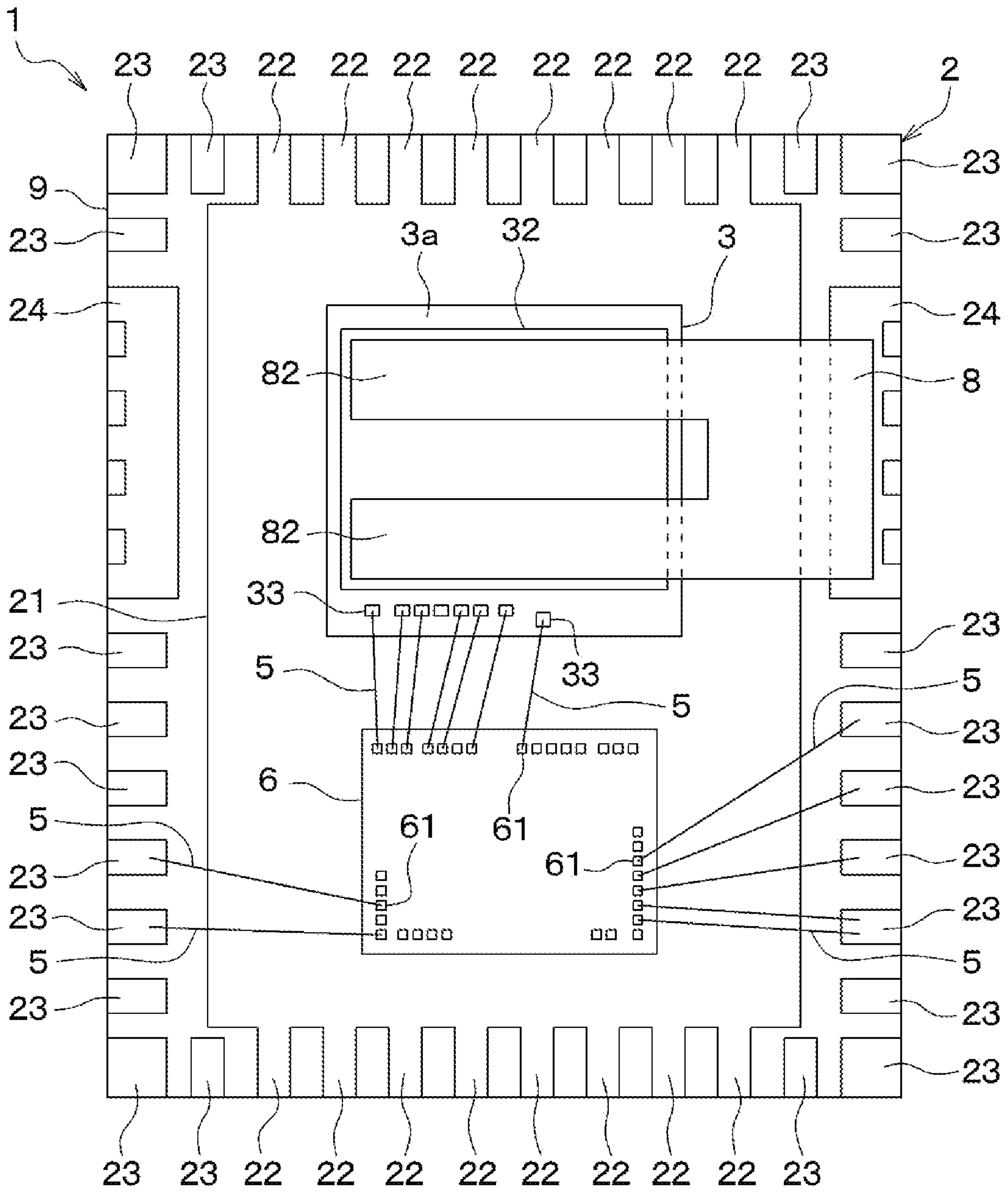
FIG. 9 is a diagram illustrating a top layout view of a semiconductor device according to a third embodiment.

The semiconductor device 1 of the present embodiment is different from the semiconductor device 1 of the first embodiment in that, for example, as shown in FIG. 9, the clip 8 has a plurality of bonding portions 82 bonded to the semiconductor element 3 and the insulating layer 7 is not included. Hereinafter, the differences from the first embodiment will be mainly described.

In the present embodiment, the clip 8 has two bonding portions 82 arranged parallel to each other with a gap therebetween. The clip 8 is obtained by, for example, providing a plate material made of Cu or the like with portions having different thicknesses by a processing such as cutting or half etching, and then performing a press punching processing to remove unnecessary portions.

For example, the two bonding portions 82 each have a rectangular shape in a top view, and are arranged parallel to each other so that the extending directions (that is, the longitudinal directions) thereof are aligned. For example, the two bonding portions 82 are arranged along two opposing sides of the plurality of sides forming the outer contour of the second electrode 32 of the semiconductor element 3, and are bonded to predetermined regions including the vicinities of the two sides. In this case, the area of the region of the second electrode 32 between the bonding portion 82 and the corresponding side of the outer contour adjacent thereto is reduced. As a result, a spreading resistance in this region is suppressed, and the amount of heat generation in the outer contour of the second electrode 32 located in the vicinity of the clip 8 is reduced.

In a portion located between the two bonding portions 82 of the clip 8, the second electrode 32 of the semiconductor element 3 is exposed, and the sealing material 9 having the lower thermal conductivity than the clip 8 is disposed. Therefore, the region of the second electrode 32 between the two bonding portions 82 has a lower heat dissipation property than the portions to which the bonding portions 82 are bonded. Since the heat generation region is dispersed in the semiconductor element 3, the region of the second electrode 32 between the two bonding portions 82 serves to suppress the local heat concentration at the neighboring portion 3*ab*.

The semiconductor device 1 of the present embodiment achieves the similar effects to those of the first embodiment. In addition, the semiconductor device 1 of the present embodiment does not have the insulating layer 7, and thus achieves the similar effects to that of the second embodiment.

(Modification of Third Embodiment)

Figure 10:
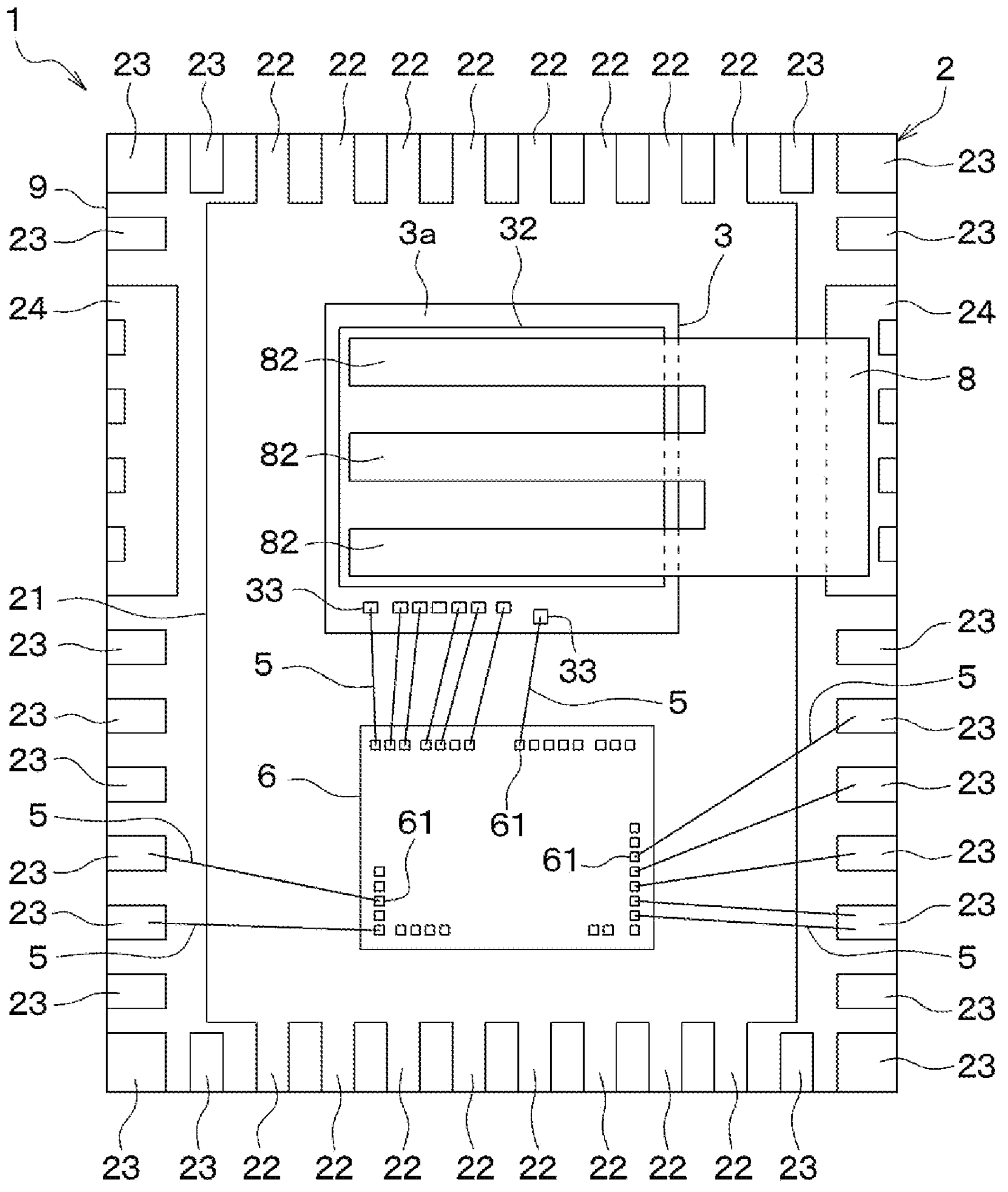
FIG. 10 is a diagram illustrating a top layout view of a modification of the semiconductor device according to the third embodiment.

A semiconductor device 1 of a third embodiment may have a configuration in which a clip 8 has three bonding portions 82 that are spaced apart from each other, for example, as shown in FIG. 10. In the configuration in which the clip 8 has the three bonding portions 82 arranged apart from each other, the gap portions between the bonding portions 82 serve as the thermal resistance portions at which the heat dissipation property is intentionally reduced as compared with the bonding portions 82. In the semiconductor device 1 in which the clip 8 has the plurality of bonding portions 82 arranged apart from each other, the local heat concentration at the boundary between the second electrode 32 and the clip 8 is suppressed, and thus the reliability of the semiconductor device 1 improves.

The shape of the clip 8 is not limited to the example described above in which the two or three bonding portions 82 are arranged parallel to each other and apart from each other. The clip 8 may have four or more bonding portions 82. The clip 8 is preferably disposed so that at least two bonding portions 82 of the plurality of bonding portions 82 are arranged along two opposing sides of the sides forming the outer contour of the second electrode 32 of the semiconductor element 3 and are bonded to regions including the vicinities of the two sides. Although not limited to, the term "vicinity" as used herein means a portion located in a distance of 1 mm or less from a side forming the outer contour of the second electrode 32, for example. In the clip 8, the number, arrangement, dimensions, and the like of the bonding portions 82 may be appropriately changed according to the electrode of the semiconductor elements 3 to be bonded.

The semiconductor device 1 of the present modification also achieves the similar effects to those of the third embodiment.

Fourth Embodiment

A semiconductor device 1 of a fourth embodiment will be hereinafter described.

Figure 11:
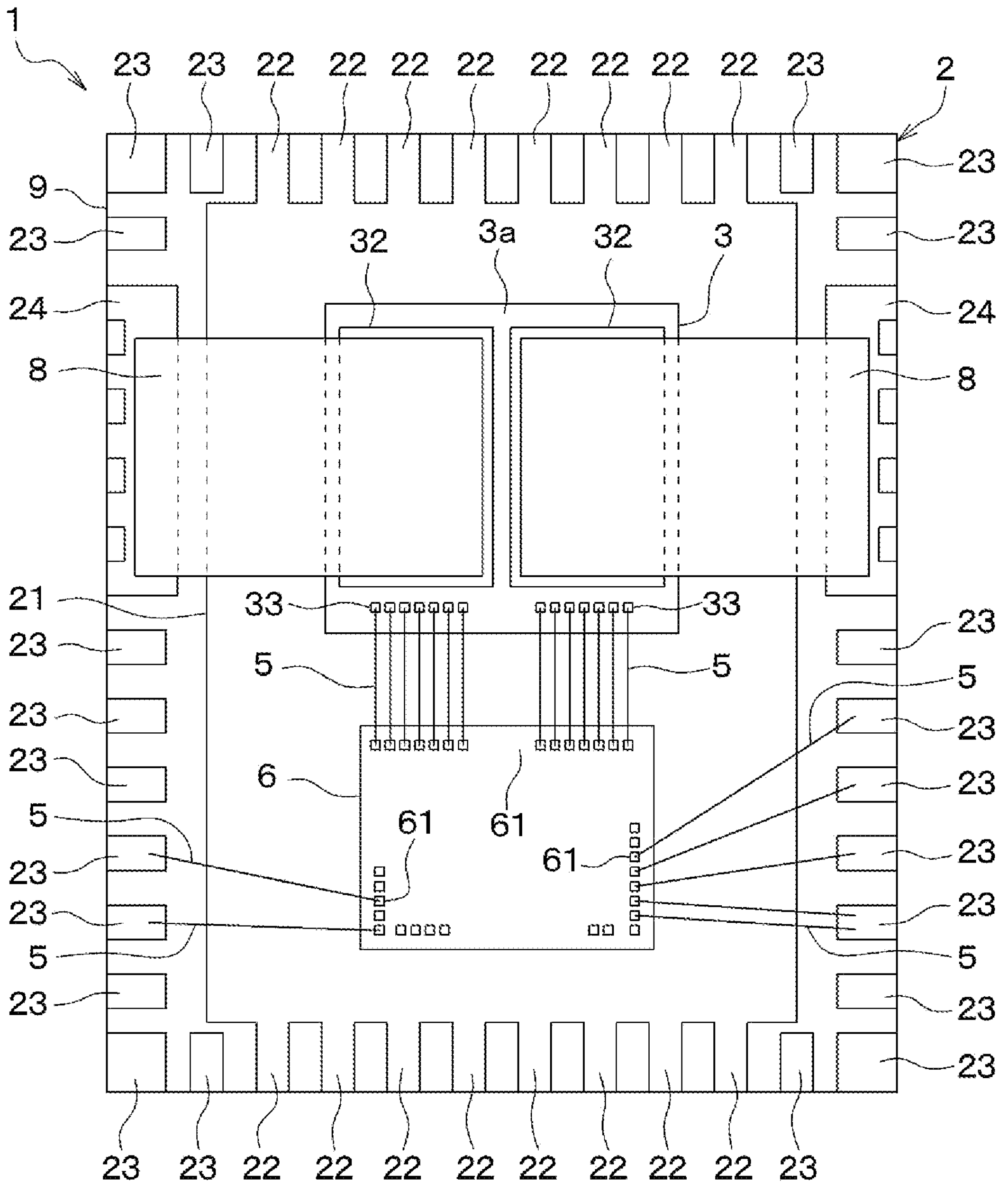
FIG. 11 is a diagram illustrating a top layout view of a semiconductor device according to a fourth embodiment.

For example, as shown in FIG. 11, the semiconductor device 1 of the present embodiment is different from the first embodiment in that the semiconductor element 3 has two second electrodes 32 on the front surface 3*a*, different clips 8 are bonded to the two second electrodes 32, and the insulating layer 7 is not provided. Hereinafter, these differences from the first embodiment will be mainly described.

In the present embodiment, the semiconductor element 3 has the two second electrodes 32 arranged apart from each other on the front surface 3*a*. The semiconductor element 3 has a configuration in which the two second electrodes 32 are paired with the first electrodes 31 on the back surface 3*b*, and a current is generated in the thickness direction, that is, in a vertical direction by applying a voltage to the third electrodes 33.

The number of the clips 8 is the same as the number of the second electrodes 32 of the semiconductor element 3, and the clips 8 are bonded to the different second electrodes 32 through the bonding material 4. The two clips 8 are bonded to one semiconductor element 3. However, the two clips 8 are independent from each other, and are arranged so as not to be in contact with each other. As a result, in the semiconductor device 1, the heat dissipation property in the region of the gap between the two second electrodes 32 of the semiconductor element 3 is lower than that in the regions bonded to the clips 8. Since the heat generation portions are dispersed, the local heat concentration in the portions positioned in the vicinities of the clips 8 is suppressed.

The semiconductor device 1 of the present embodiment also achieves the similar effects to those of the first embodiment described above. In addition, since the semiconductor device 1 does not have the insulating layer 7, the similar effects to those of the second embodiment can also be achieved.

Other Embodiments

Although the present disclosure has been described in accordance with the embodiments, it is understood that the present disclosure is not limited to such embodiments and structures. The present disclosure encompasses various modifications and variations within the scope of equivalents. In addition, various combinations and modes, and other combinations and modes including only one element, more elements, or less elements are also within the scope and idea of the present disclosure.

For example, in each of the embodiments described above, the configuration in which one semiconductor element 3 and one control IC 6 are mounted on one die pad 21 has been described as a representative example, but the configuration of the semiconductor device 1 is not limited thereto. For example, the semiconductor device 1 may include a plurality of independent die pads 21, and the semiconductor element 3 and the control IC 6 may be mounted on different die pads 21.

The semiconductor device 1 may have a configuration in which the control IC 6 is not disposed inside the sealing material 9 and the semiconductor element 3 is connected to the control IC 6 disposed outside.

Further, the semiconductor device 1 may have, for example, a configuration in which two semiconductor elements 3 are arranged inside the sealing material 9, that is, a so-called 2-in-1 configuration, or a configuration in which three or more semiconductor elements 3 are arranged in the sealing material 9. In this case, the configuration of the lead frame 2, the number of the clips 8, and the like are appropriately changed according to the number of the semiconductor elements 3 and the like.

What is claimed is:

1. A semiconductor device comprising:

a lead frame;

a semiconductor element mounted on the lead frame;

a clip bonded through a bonding material to an electrode on a surface of the semiconductor element opposite to the lead frame;

a sealing material covering the semiconductor element and the clip; and an insulating layer serving as a thermal resistance portion, the insulating layer disposed in a bonding region in which the clip is bonded through the bonding material and which is defined between the electrode of the semiconductor element and a bonding surface of the clip, wherein the insulating layer is covered with the bonding material, and has a thermal resistance higher than that of a different portion in the bonding region, and in a plan view, the insulating layer is disposed within an outer contour of the electrode.

2. The semiconductor device according to claim 1, wherein in the bonding region, a single insulating layer is disposed at a position separated from an the outer contour of the electrode.

3. The semiconductor device according to claim 1, wherein in the plan view, the insulating layer is spaced inward from the outer contour of the electrode.

4. The semiconductor device according to claim 1, wherein the insulating layer is disposed on the electrode.

5. A semiconductor device comprising:

a lead frame;

a semiconductor element mounted on the lead frame;

a clip bonded through a bonding material to an electrode on a surface of the semiconductor element opposite to the lead frame;

a sealing material covering the semiconductor element and the clip; and an insulating layer serving as a thermal resistance portion, the insulating layer disposed in a bonding region bonded through the bonding material between the semiconductor element and the clip, wherein the insulating layer is covered with the bonding material, and has a thermal resistance higher than that of a different portion in the bonding region, the insulating layer includes a plurality of island portions that are independent from each other, and the plurality of island portions are arranged at positions separated from an outer contour of the electrode in the bonding region.

* * * * *